(12) United States Patent
Kawana et al.

(10) Patent No.: US 7,416,832 B2
(45) Date of Patent: Aug. 26, 2008

(54) POSITIVE RESIST COMPOSITION

(75) Inventors: Daisuke Kawana, Kawasaki (JP); Tomotaka Yamada, Kawasaki (JP); Takayuki Hosono, Kawasaki (JP); Koki Tamura, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 11/091,618

(22) Filed: Mar. 28, 2005

(65) Prior Publication Data

US 2005/0221225 A1    Oct. 6, 2005

(30) Foreign Application Priority Data

Mar. 30, 2004   (JP)   ............................. 2004-098184

(51) Int. Cl.
  *G03C 1/73*   (2006.01)
  *G03F 7/039*   (2006.01)
(52) U.S. Cl. .................... 430/270.1; 430/326; 430/905; 430/914; 430/919
(58) Field of Classification Search ........................ None
    See application file for complete search history.

(56) References Cited

U.S. PATENT DOCUMENTS

| | | | |
|---|---|---|---|
| 5,399,462 A | 3/1995 | Sachdev et al. | |
| 5,976,759 A | 11/1999 | Urano et al. | |
| 6,048,661 A * | 4/2000 | Nishi et al. | ............... 430/270.1 |
| 6,506,535 B1 * | 1/2003 | Mizutani et al. | ......... 430/270.1 |
| 2004/0229161 A1 * | 11/2004 | Yasunami et al. | ........ 430/270.1 |
| 2004/0253535 A1 * | 12/2004 | Cameron et al. | ......... 430/270.1 |

FOREIGN PATENT DOCUMENTS

| | | |
|---|---|---|
| CN | 1159459 | 9/1997 |
| JP | 04-130324 | 5/1992 |
| JP | 06-202338 | 7/1994 |
| JP | 08-29987 | 2/1996 |
| JP | 2001-51422 | 2/2001 |
| JP | 2003-167364 | 6/2003 |

OTHER PUBLICATIONS

Office action in the counterpart Chinese Application No. 200510062425.6, dated Mar. 14, 2008.

* cited by examiner

*Primary Examiner*—Sin Lee
(74) *Attorney, Agent, or Firm*—Knobbe, Martens, Olson & Bear LLP

(57) ABSTRACT

A positive resist composition capable of forming a resist pattern having excellent shape is provided. This composition is a positive resist composition including a base resin component (A) and an acid generator component (B) generating an acid under exposure, which are dissolved in an organic solvent, wherein the base resin component (A) is a silicone resin, and the organic solvent contains propylene glycol monomethyl ether (x1) and a solvent (S2) having a boiling point higher than that of the propylene glycol monomethyl ether.

12 Claims, No Drawings

POSITIVE RESIST COMPOSITION

BACKGROUND OF THE INVENTION

1. Field of the Invention

The present invention relates to a positive resist composition.

This application claims priority from Japanese Patent Application No. 2004-98184 filed on Mar. 30, 2004, the disclosure of which is incorporated by reference herein.

2. Description of the Related Art

In the production of semiconductor devices and light crystal display devices, fine working has rapidly advanced, recently with progress in lithography techniques. A light source having a shorter wavelength is generally employed for fine working. Specifically, ultraviolet rays typified by g-rays and i-rays have conventionally been used, but now KrF excimer laser (248 nm) and ArF excimer laser (193 nm) have been introduced.

As one of the resist materials which satisfy the conditions of high definition capable of reproducing a pattern having a fine size, for example, there is known a chemically amplified resist composition comprising a base resin and an acid generator generating an acid under exposure, which are dissolved in an organic solvent, wherein alkali solubility changes due to an action of an acid generated from the acid generator.

As the base resin component of the chemically amplified resist, for example, there can be used polyhydroxystyrene (PHS) having high transparency to KrF excimer laser (248 nm), PHS resin wherein a portion of hydroxyl groups of PHS are protected with an acid dissociable dissolution inhibiting group and a copolymer derived from a (meth)acrylate ester. As the acid generator, for example, onium salt-based acid generators such as iodonium salt and sulfonium salt are now used most popularly.

As the organic solvent, for example, propylene glycol monomethyl ether acetate (which hereinafter referred to as PGMEA), ethyl lactate (which hereinafter referred to as EL), methyl amyl ketone (which hereinafter referred to as MAK) and propylene glycol monomethyl ether (which hereinafter referred to as PGME) are used alone or in combination. However, when these solvents are used alone, there arise a problem that a base resin may be agglomerated in a resist composition.

As the solvent mixture, a solvent mixture of PGMEA and EL (which hereinafter referred to as EM) is used most popularly because it is excellent in the effect of inhibiting agglomeration of the base resin (see, for example, Patent Document 1). It is considered that the effect of inhibiting agglomeration of the base resin in the solvent mixture such as EM is exerted because polarity of the entire organic solvent changes by mixing two kinds of solvents having different polarities.

As a method capable of forming a resist pattern having a high aspect ratio with high resolution, for example, a two-layer resist method using a chemically amplified resist has been proposed (see, for example, Patent Documents 2 and 3). According to this method, an organic film as a lower resist layer is formed on a substrate and then an upper resist layer is formed thereon using a chemically amplified resist containing a silicone resin as a base resin. After forming a resist pattern on the upper resist layer by a photolithography technique, the resist pattern is transferred to the lower resist layer by etching using the resist pattern as a mask to form a resist pattern having a high aspect ratio.

Patent Document 1: Japanese Patent Application, First Publication No. 2003-167364

Patent Document 2: Japanese Patent Application, First Publication No. Hei 6-202338

Patent Document 3: Japanese Patent Application, First Publication No. Hei 8-29987

However, when the resist pattern is formed by using the chemically amplified resist containing the silicone resin, there arise problems such as line width roughness (LWR) wherein the upper portion of the resist pattern has roundness and the line pattern has non-uniform line width, and line edge roughness (LER) wherein the side wall of the line pattern has irregular surfaces, and thus the resulting pattern has poor shape. With the recent increase of demand for high definition, it becomes important to solve the problems of the shape such as LWR and LER.

SUMMARY OF THE INVENTION

Under these circumstances, the present invention has been made and an object of thereof is to provide a positive resist composition capable of forming a resist pattern which is excellent in shape.

The present inventors have intensively studied and found that the above object is achieved by a positive resist composition wherein a silicone resin is used as a base resin and two or more kinds of specific solvents are used as an organic solvent, and thus the present invention has been completed.

The present invention is directed to a positive resist composition comprising a base resin component (A) and an acid generator component (B) generating an acid under exposure, which are dissolved in an organic solvent, wherein the base resin component (A) is a silicone resin, and the organic solvent contains PGME and a solvent (S2) having a boiling point higher than that of PGME.

In the present invention, exposure also includes irradiation with an electron beam. The "constituent unit" means a monomer unit constituting a polymer.

The present invention provides a positive resist composition capable of forming a resist pattern which is excellent in shape.

DESCRIPION OF THE PREFERRED EMBODIMENTS

The present invention will now be described in more detail.

The positive resist composition of the present invention includes a base resin component (A) (which hereinafter may be referred to as component (A)) and an acid generator component (B) generating an acid under exposure (which hereinafter may be referred to as component (B)), which are dissolved in an organic solvent.

In the positive resist composition, when an action of the acid generated from the component (B) is exerted, the entire positive resist composition, which is insoluble in an alkali, becomes soluble in an alkali. Therefore, when the positive resist composition applied onto a substrate is selectively exposed via a mask pattern in the formation of a resist pattern, alkali solubility of the exposed area enhances, and thus alkali development can be attained.

(Organic Solvent)

A feature of the present invention is that it contains, as an organic solvent, PGME and a solvent (S2) having a boiling point higher than that of PGME (which hereinafter may be referred to as solvent (S2)).

PGME has a boiling point of 120° C.

The content of PGME in the organic solvent is preferably from 10 to 60% by weight, and more preferably from 20to 40% by weight. When the content is 10% by weight or more, the effects of the present invention may be sufficient. On the other hand, when the content is more than 60% by weight, a pattern shape may become worse because of too high volatility of the overall organic solvent.

The solvent (S2) may be any one having a boiling point higher than 120° C. as the boiling point of PGME, which can dissolve the respective components to form a uniform solution and includes, for example, those having a boiling point of higher than 120° C. among solvents which have conventionally been known as solvents for a chemically amplified resist.

Among these solvents, a solvent having a boiling point which is at least 20° C. higher than that of PGME is preferable, and a solvent having a boiling point which is at least 25° C. higher than that of PGME is more preferable. The upper limit of the boiling point is not specifically limited, but is preferably about 250° C. or lower, and more preferably 210° C. or lower.

Examples of the known solvent include GBL (γ-butyrolactone); ketones such as acetone, methyl ethyl ketone, cyclohexanone, MAK (methyl n-amyl ketone), methyl isoamyl ketone and 2-heptanone;

polyhydric alcohols and derivatives thereof, such as glycols such as ethylene glycol, diethylene glycol, propylene glycol and dipropylene glycol; glycol esters such as ethylene glycol monoacetate, diethylene glycol monoacetate, propylene glycol monoacetate and dipropylene glycol monoacetate; glycol ethers of them such as monomethyl ether, monoethyl ether, monopropyl ether, monobutyl ether or monophenyl ether of these glycols or glycol esters;

cyclic ethers such as dioxane; and esters of monohydric alcohol, such as methyl lactate, EL (ethyl lactate), methyl acetate, ethyl acetate, butyl acetate, methyl pyruvate, ethyl pyruvate, methyl methoxypropionate and ethyl ethoxypropionate.

The solvent (S2) is preferably at least one selected from the group consisting of PGMEA (boiling point: 146° C.), EL (boiling point: 155° C.) and GBL (boiling point: 204° C.), and particularly preferably EL because excellent effects are exerted.

These solvents (S2) may be used alone or in combination.

The content of the solvent (S2) in the organic solvent is preferably within a range from 40 to 90% by weight, and more preferably from 50 to 80% by weight. When the content is within the above range, sufficient effects of the invention are exerted.

The ratio of PGME to the solvent (S2) in the organic solvent is preferably from 10:90 to 50:50, and more preferably from 20:80 to 40:60.

In the present invention, the organic solvent may contain the organic solvent other than PGME and the solvent (S2), that is, a solvent (x3) having a boiling point equal to or lower than that of propylene glycol monomethyl ether. In view of the effects of the present invention, a solvent mixture of PGME and the solvent (S2) is preferable.

Examples of the solvent (x3) include those having a boiling point of 120° C. or lower among known solvents described above.

The content of the organic solvent is not specifically limited and is appropriately set according to the content, which enables application of the resulting coating solution onto the substrate, according to the thickness of the coating film. It is preferably set so that the solid content of the resist composition is within a range from 2 to 20% by weight, and preferably from 5 to 15% by weight.

In the present invention, since a rigid film can be formed In the case of small solid content of the resin by using an organic solvent containing PGME and a solvent (S2), the solid content in the resist composition can be decreased and thus a film having sufficient etching resistance can be formed under the same film forming conditions (for example, baking temperature) as those of the prior art.

(Component (A))

A feature of the positive resist composition of the present invention is that the component (A) is a silicone resin.

The silicone resin is a resin having an organic group such as an alkyl group or aryl group among polysiloxanes having a repeating structure of a siloxane bond in which a silicon atom and an oxygen atom are combined.

As the silicone resin, a silicone resin proposed as a base resin of a positive resist composition can be generally used and includes, for example, a silsesquioxane resin having a constituent unit in which one silicon atom is combined with 3/2 oxygen atoms and one organic group.

In the present invention, the content (silicon content) of a silicon atom derived from the component (A) is preferably from 5 to 30% by weight, and more preferably from 8 to 20% by weight, based on the total solid content of the positive resist composition. When the content is not less than the lower limit, excellent effects of the present invention are exerted. Also the resistance to dry etching such as oxygen plasma etching used in the case of etching of the substrate is improved. On the other hand, when the content is not more than the upper limit, good quantitative balance with the other components (finally, balance between various properties) is attained.

The silicon content can be adjusted by adjusting the silicon content of the silicone resin used as the component (A) and/or the amount of the component (A) in the positive resist composition.

In the present invention, the component (A) includes a resin component (A1) having an acid dissociable dissolution inhibiting group, the dissolution inhibiting group being dissociated by an action of an acid thereby to enhance alkali solubility, and an alkali soluble resin component (A2).

In the case in which the component (A) is the resin component (A1), the acid dissociable dissolution inhibiting group contained in the resin component (A1) is dissociated by the acid generated from the component (B), thereby to enhance alkali solubility of the exposed area.

In the case in which the component (A) is the resin component (A2), the positive resist composition of the present invention contains below-mentioned low molecular weight dissolution inhibitor (C) having an acid dissociable dissolution inhibiting group, the acid dissociable dissolution inhibiting group being dissociated by an action of an acid. That is, the acid dissociable dissolution inhibiting group contained in the low molecular weight dissolution inhibitor (C) is dissociated by the acid generated from the component (B), thereby to enhance alkali solubility of the exposed area.

Preferable examples of the resin component (A1) include the following silsesquioxane resin (A11) and silsesquioxane resin (A12).

Preferable examples of the resin component (A2) include the following silsesquioxane resin (A21).

(Silsesquioxane Resin (A11))

The silsesquioxane resin (A11) includes a constituent unit (a1) represented by the following general formula (I):

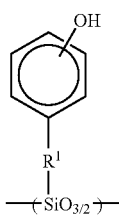

(I)

wherein R¹ represents a linear or branched alkylene group having 1 to 5 carbon atoms, a constituent unit (a2) represented by the following general formula (II):

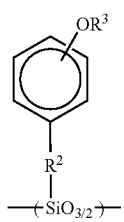

(II)

wherein R² represents a linear or branched alkylene group having 1 to 5 carbon atoms, and R³ represents an acid dissociable dissolution inhibiting group, and a constituent unit (a3) represented by the following general formula (III):

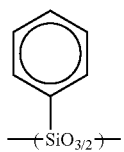

(III)

In the constituent unit (a1), R¹ is preferably a lower alkylene group having 1 to 5 carbon atoms, and is more preferably a methylene group in view of the synthesis of the resin. The position of the hydroxyl group may be any of the o-, m- and p-positions, and is preferably the p-position from industrial points of view.

In the constituent unit (a2), R² is also preferably a lower alkylene group having 1 to 5 carbon atoms, and more preferably a methylene group in view of the synthesis of the resin.

In the constituent unit (a2), R³ is preferably an acid dissociable dissolution inhibiting group.

In the present invention, the term "acid dissociable dissolution inhibiting group" is a group which has alkali dissolution inhibiting properties capable of making the entire positive resist composition insoluble in an alkali before exposure, and which is dissociated due to an action of an acid generated from the component (B), thereby making the entire positive resist composition soluble in an alkali, in the process for formation of a resist pattern using the positive resist composition.

Therefore, when the resist composition containing the silsesquioxane resin (A11) is applied onto a substrate and then exposed via a mask pattern, alkali solubility of the exposed area enhances and thus a resist pattern can be formed by alkali development.

R³ may be an acid dissociable dissolution inhibiting group which can be substituted with a hydrogen atom of a phenolic hydroxyl OH group, and can be appropriately elected from various groups according to a light source to be used. Specific examples thereof include tertiary alkyloxycarbonyl groups such as tert-butoxycarbonyl group and tert-amyloxycarbonyl group; tertiary alkyl groups such as tert-butyl group and tert-amyl group; tertiary alkoxycarbonylalkyl groups such as tert-butoxycarbonylmethyl group and tert-butoxycarbonylethyl group; alkoxyalkyl groups such as 1-ethoxyethyl group, 1-isopropoxyethyl group, 1-methoxy-1-methylethyl group, 1-methoxypropyl group and 1-n-butoxyethyl group; and cyclic ether groups such as tetrahydropyranyl group and tetrahydroalanyl group.

Among these groups, an alkoxyalkyl group is preferable because elimination energy is low and dissolution contrast can be obtained with ease, thus making it possible to improve lithography characteristics. The number of carbon atoms of an alkoxy group in the alkoxyalkyl group is preferably from 1 to 3, and the number of carbon atoms of an alkyl group is preferably from 1 to 6. The alkoxyalkyl group is preferably a 1-ethoxyethyl group.

The position of —OR³ may be any of the o-, m- and p-positions, and is preferably the p-position from industrial points of view.

The silsesquioxane resin (A11) may contain a constituent unit (a4), which does not adversely affect the effects of the present invention, in addition to the constituent units (a1) to (a3).

Specific examples of the constituent unit (a4) include a constituent unit represented by the following general formula (VI):

(IV)

wherein R⁴ represents a linear, branched or cyclic alkyl group having 1 to 15 carbon atoms.

With respect to the content of each constituent unit in the resin, the total content of the constituent units (a1) and (a2) is preferably 50% by mole or more based on the total amount of all constituent units of the silsesquioxane resin (A11). When the total content of the constituent units (a1) and (a2) is less than 50% by mole, solubility in the alkali developing step may be insufficient.

The constituent unit (a3) is a constituent unit which contributes to an improvement in heat resistance. When the content of the constituent unit (a3) in the silsesquioxane resin (A11) is less than 10%, sufficient effect of improving heat resistance may not be exerted. Therefore, the total content of the constituent units (a1) and (a2) is preferably 90% by mole or less.

Therefore, the total content of the constituent units (a1) and (a2) is preferably from 50 to 90% by mole, and more preferably from 60 to 80% by mole. The content of the constituent unit (a3) is preferably from 10 to 50% by mole, and more preferably 20 to 40% by mole.

The content of the constituent unit (a2) is preferably 8% by mole or more based on the total amount of the constituent units (a1) and (a2).

The smaller the content of the constituent unit (a2) based on the total amount of the constituent units (a1) and (a2), the more the dissolution inhibiting effect due to introduction of the acid dissociable dissolution inhibiting group ($R^3$) decreases. Therefore, a change in alkali solubility before and after the exposure of the silsesquioxane resin (A11) decreases. On the other hand, when the content of the constituent unit (a2) is too large, a portion of the acid dissociable dissolution inhibiting groups may remain without being completely dissociated after passing through the exposure and PEB steps. The acid dissociable dissolution inhibiting groups remaining without being completely dissociated may not be removed by rinsing, thereby causing defects. When the content of the constituent unit (a2) is large, heat resistance of the component (A) may be lowered.

Therefore, the content of the constituent unit (a2) is preferably from about 8 to 25% by mole, and more preferably from about 10 to 20% by mole, based on the total amount of the constituent units (a1) and (a2).

If the shape of the desired resist pattern is a line-and-space pattern, larger content of the constituent unit (a3) in the silsesquioxane resin (A11) improves line edge roughness, and thus the resulting resin (A11) is suited for fine working. In this case, the content of the constituent unit (a3) is preferably from 25 to 50% by mole, and more preferably from 30 to 40% by mole. The term "line edge roughness" as used herein refers to irregularity of the line side wall. $3\sigma$ as a measure of line edge roughness of the line-and-space pattern is a triple value ($3\sigma$) of a standard deviation ($\sigma$) calculated from the results of the measurement of the width of the resist pattern of samples at 32 positions using a measuring SEM (manufactured by Hitachi, Ltd. under the trade name of "S-9220"). The smaller the value of $3\sigma$, the less roughness and more uniform width the resulting resist pattern may have.

If the shape of the desired resist pattern is a hole pattern, when the content of the constituent unit (a3) in the silsesquioxane resin (A11) is large, edge roughness of the hole pattern is improved; however, definition may be lowered. Therefore, the content of the constituent unit (a3) is preferably from 25 to 35% by mole, and more preferably from 25 to 30% by mole.

When the silsesquioxane resin (A11) contains the other constituent unit (a4), the content is preferably 25% by mole or less, and more preferably 15% by mole or less.

The constituent unit (a3) or the constituent units (a3) and (a4) preferably constitutes the remainder other than the constituent unit (a1) and (a2) in the silsesquioxane resin (A11), that is, 50% by mole or less. The silsesquioxane resin (A11) is preferably composed of only the constituent units (a1) to (a3) or the constituent units (a1) to (a4).

Polystyrene equivalent weight average molecular weight (Mw) determined using gel permeation chromatography (which hereinafter may be abbreviated as GPC) of the silsesquioxane resin (A11) is not specifically limited, but is preferably within a range from 2000 to 15000, and more preferably from 5000 to 10000. When the weight average molecular weight is more than the above range, solubility in an organic solvent may decrease. On the other hand, when the weight average molecular weight is less than the above range, a resist pattern profile may be degraded.

The ratio Mw/number average molecular weight (Mn) is not specifically limited, but is preferably within a range from 1.0 to 6.0, and more preferably from 1.0 to 2.0. When the ratio is above the above range, resolution and pattern shape may be degraded.

The silsesquioxane resin (A11) in the present invention can be produced, for example, by obtaining a polymer including constituent units (a1) and (a3) or a polymer including constituent units (a1), (a3) and (a4) using the method described in Japanese Patent No. 2,567,984, and substituting a hydrogen atom of a phenolic hydroxyl group in a portion of the side chain of the constituent unit (a1) with an acid dissociable dissolution inhibiting group to form a constituent unit (a2) using a well-known technique.

As the monomer of the constituent unit (a4), alkyltrialkoxysilane or alkyltrichlorosilane can be used.

In the step of introducing an acid dissociable dissolution inhibiting group, a polymer including constituent units (a1), (a2) and (a3) or a polymer including constituent units (a1), (a2), (a3) and (a4) can be obtained by dissolving the above polymer in an organic solvent, adding a base or acid catalyst, and a compound corresponding to the acid dissociable dissolution inhibiting group, reacting the polymer solution at a temperature of about 20 to 70° C. for about 1 to 10 hours, adding an acid or base to the reaction solution, thereby to neutralize the reaction, and pouring the reaction solution into water with stirring to deposit a polymer. The base or acid catalyst may be used properly according to the compound corresponding to the acid dissociable dissolution inhibiting group.

The content of the constituent units (a1) and (a2) can be controlled according to the amount of the compound corresponding to the acid dissociable dissolution inhibiting group to be introduced.

(Silsesquioxane Resin (A12))

The silsesquioxane resin (A12) includes a constituent unit (a1) represented by the above general formula (I) and a constituent unit (a5) represented by the following general formula (V):

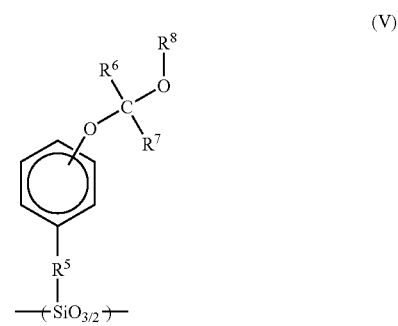

(V)

wherein $R^5$ represents a linear or branched alkylene group having 1 to 5 carbon atoms, $R^6$ represents an alkyl group having 1 to 5 carbon atoms, $R^7$ represents an alkyl group having 1 to 5 carbon atoms or a hydrogen atom, and $R^8$ represents an alicyclic hydrocarbon group having 5 to 15 carbon atoms.

In the silsesquioxane resin (A12), $R^1$ of the constituent unit (a1) is preferably a linear or branched alkylene group having 1 to 5 carbon atoms, and more preferably a linear or branched alkylene group having 1 to 3 carbon atoms, in view of the synthesis of the resin. The position of the hydroxyl group may be any of the o-, m- and p-positions, and is preferably the p-position from industrial points of view.

In the constituent unit (a5), similar to $R^1$, $R^5$ is preferably a linear or branched alkylene group having 1 to 5 carbon atoms, and more preferably a linear or branched alkylene group having 1 to 3 carbon atoms, in view of the synthesis of the resin.

$R^6$ is preferably a linear or branched alkyl group having 1 to 5 carbon atoms, and more preferably a methyl group or an ethyl group.

R[7] is preferably a linear or branched alkyl group having 1 to 5 carbon atoms or a hydrogen atom, and more preferably a hydrogen atom.

R[8] is preferably an alicyclic hydrocarbon group having 5 to 15 carbon atoms, more preferably a cycloalkyl group having 5 to 7 carbon atoms such as a cyclopentyl group or cyclohexyl group, and most preferably a cyclohexyl group from industrial points of view because the price thereof is low.

The functional group represented by the following general formula (VI) in the constituent unit (a5) functions as the acid dissociable dissolution inhibiting group.

Therefore, when a resist-composition containing the silsesquioxane resin (A12) is applied onto a substrate and then exposed via a mask pattern, alkali solubility of the exposed area is enhanced and thus a resist pattern can be formed by alkali development.

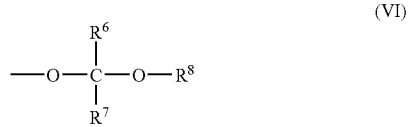

(VI)

The position of the acid dissociable dissolution inhibiting group represented by the general formula (VI) may be any of the o-, m- and p-positions, and is preferably the p-position from industrial points of view.

With respect to the content of each constituent unit in the resin, the total content of the constituent units (a1) and (a5) is preferably 50% by mole or more based on the total amount of all constituent units of the silsesquioxane resin (A12), and may be 100% by mole. When the total content of the constituent units (a1) and (a5) is less than 50% by mole, solubility in the alkali developing step may be insufficient. Therefore, the total content of the constituent units (a1) and (a5) is preferably from 50 to 90% by mole, and more preferably from 60 to 80% by mole.

The content of the constituent unit (a5) is preferably from 5 to 50% by mole, and more preferably from 5 to 15% by mole, based on the total amount of the constituent units (a1) and (a5). The smaller the content of the constituent unit (a5) based on the total amount of the constituent units (a1) and (a5), the more the dissolution inhibiting effect due to introduction of the acid dissociable dissolution inhibiting group decreases.

Therefore, a change in alkali solubility before and after the exposure of the silsesquioxane resin (A12) decreases. On the other hand, when the content of the constituent unit (a5) is too large, a portion of the acid dissociable dissolution inhibiting groups may remain without being completely dissociated after passing through the exposure and PEB steps.

The acid dissociable dissolution inhibiting groups remained without being completely dissociated may not be removed by rinsing, thereby to cause defects. When the content of the constituent unit (a5) is large, heat resistance of the component (A) may be lowered.

The silsesquioxane resin (A12) may further contain a constituent unit (a1) represented by the general formula (III).

The constituent unit (a3) is not essential. However, when the silsesquioxane resin (A12) contains the constituent unit (a3), heat resistance of the resist pattern is improved.

If the shape of the desired resist pattern is a line-and-space pattern, line edge roughness is effectively improved when the silsesquioxane resin (A12) contains the constituent unit (a3). In this case, the content of constituent unit (a3) in the silsesquioxane resin (A12) is preferably from 20 to 50% by mole, and more preferably from 30 to 40% by mole.

The silsesquioxane resin (A12) may contain, in addition to the constituent units (a1), (a5) and (a3), the above-mentioned constituent unit (a4) which does not adversely affect the effects of the present invention.

When the silsesquioxane resin (A12) contains the above or other constituent unit (a4), the content is preferably 20% by mole or less, and more preferably 15% by mole or less.

The constituent unit (a3) or the constituent units (a3) and (a4) preferably constitutes the remainder other than the constituent unit (a1) and (a2) in the silsesquioxane resin (A12), that is, 50% by mole or less. The silsesquioxane resin (A12) is preferably composed of only the constituent units (a1), (a5) and (a3) or the constituent units (a1), (a5), (a3) and (a4).

The weight average molecular weight (Mw) of the silsesquioxane resin (A12) is not specifically limited, but is preferably within a range from 2000 to 15000, and more preferably from 5000 to 10000. When the weight average molecular weight is above the above range, solubility in an organic solvent may become worse. On the other hand, when the weight average molecular weight is below the above range, a resist pattern profile may become worse.

The ratio Mw/Mn is not specifically limited, but is preferably within a range from 1.0 to 6.0, and more preferably from 1.0 to 2.0. When the ratio is above the above range, resolution and pattern shape may become worse.

When silsesquioxane resin (A12) in the present invention includes constituent units (a1) and (a5), it can be produced, for example, by obtaining a polymer including a constituent unit (a1) using a well-known polymerization method, and introducing an acid dissociable dissolution inhibiting group (VI) into a phenolic hydroxyl group in a portion of the side chain of the constituent unit (a1) to form a constituent unit (a5) using a well-known technique.

The silsesquioxane resin including constituent units (a1), (a5) and (a3) can be produced, for example, by obtaining a polymer including constituent units (a1) and (a3), as shown in synthesis examples described hereinafter, using the method described in Japanese Patent No. 2,567,984, and introducing an acid dissociable dissolution inhibiting group (VI) into a phenolic hydroxyl group in a portion of the side chain of the constituent unit (a1) using a well-known technique.

The silsesquioxane resin including constituent units (a1), (a5), (a3) and (a4) can be produced, for example, by obtaining a polymer including constituent units (a1), (a3) and (a4), and introducing an acid dissociable dissolution inhibiting group (VI) into a phenolic hydroxyl group in a portion of the side chain of the constituent unit (a1) using a well-known technique. As the monomer of the constituent unit (a4), alkyltrialkoxysilane or alkyltrichlorosilane can be used.

In the step of introducing the acid dissociable dissolution inhibiting group (VI), a polymer including the above respective constituent units and a constituent unit (a5) can be obtained by dissolving the polymer including the constituent unit (a1), the polymer including the constituent units (a1) and (a3) or the polymer including the constituent units (a1), (a3) and (a4) in an organic solvent, adding a base or acid catalyst, and a compound corresponding to the acid dissociable dissolution inhibiting group (VI), reacting the polymer solution at a temperature of about 20 to 70° C. for about 1 to 10 hours, adding an acid or base to the reaction solution, thereby to neutralize the reaction, and pouring the reaction solution into water with stirring to deposit a polymer. The base or acid catalyst may be used properly according to the compound corresponding to the acid dissociable dissolution inhibiting group (VI).

The content of the constituent unit (a5) can be controlled by the amount of the compound corresponding to the acid dissociable dissolution inhibiting group to be introduced.

(Silsesquioxane Resin (A21))

The silsesquioxane resin (A21) includes a constituent unit (a1) represented by the above general formula (I), a constituent unit (a7) represented by the following general formula (VII):

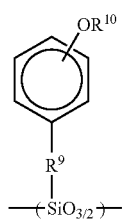

(VII)

wherein $R^9$ represents a linear or branched alkylene group having 1 to 5 carbon atoms, and $R^{10}$ represents a linear or branched alkyl group having 1 to 5 carbon atoms, and a constituent unit (a3) represented by the above general formula (III).

In the general formula (VII), similar to $R^1$, $R^9$ is preferably a linear or branched alkylene group having 1 to 5 carbon atoms, and more preferably a linear or branched alkylene group having 1 to 3 carbon atoms, in view of the synthesis of the resin.

$R^{10}$ is most preferably a methyl group.

The position of —$OR^{10}$ in the general formula (VII) may be any of the o-, m- and p-positions, and is preferably the p-position from industrial points of view.

With respect to the content of these constituent units, the content of the constituent unit (a1) is preferably selected within a range from 10 to 70% by mole, and more preferably from 20 to 55% by mole; the content of the constituent unit (a7) is preferably selected within a range from 5 to 50% by mole, and more preferably from 10 to 40% by mole; and the constituent unit (a3) is preferably selected within a range from 10 to 60% by mole, and more preferably from 20 to 40% by mole.

The constituent unit (a7) has a function of adjusting solubility in an alkali, thereby to inhibit thickness loss and to prevent roundness of a resist pattern profile. It is advantageous that this constituent unit (a7) can be introduced with ease by inhibiting the dissociation degree of the alkoxy group because it is the same as the starting material of the constituent unit (a1).

The silsesquioxane resin (A2 1) may contain, in addition to the constituent units (a1), (a7) and (a3), the above-mentioned constituent unit (a4) which does not adversely affect the effects of the present invention.

When the silsesquioxane resin (A21) contains the above or other constituent unit (a4), the content is preferably 20% by mole or less, and more preferably 15% by mole or less.

In the positive resist composition of the present invention, the rate of the silsesquioxane resin (A21) dissolved in an alkali may be adjusted from 0.05 to 50 nm/sec, and preferably 5.0 to 30 nm/sec, by adjusting the content of the constituent unit (a7) in the silsesquioxane resin (A21).

As used herein, the rate of the silsesquioxane resin (A21) dissolved in the alkali is a rate of dissolution in an aqueous 2.38 wt % TMAH (tetramethylammonium hydroxide) solution.

By adjusting to the dissolution rate of 50 nm/sec or less, thickness loss can be sufficiently inhibited and roundness of the resist pattern profile can be prevented. Also the effect of improving definition and reducing defects can be exerted. By adjusting to the dissolution rate of 0.05 nm/sec or more, a resist can be obtained by dissolving in an organic solvent.

The dissolution rate can be adjusted by changing the content of the constituent unit (a7). For example, the dissolution rate can be decreased by increasing the content of the constituent unit (a7).

The rate of dissolution in the alkali is determined by the following procedure.

First, a solution prepared by dissolving the silsesquioxane resin (A21) in an organic solvent is applied onto a silicon wafer and the organic solvent is vaporized by a heating treatment (prebaking (PAB)) to form a resin coating film (thickness: 500 to 1300 nm, for example, thickness: 1000 nm). The organic solvent is appropriately selected from known organic solvents used in a chemically amplified photoresist composition as described hereinafter, and preferably it is a solvent mixture (ethyl lactate/propylene glycol monoethyl ether=80/20 (weight ratio)). The content of the silsesquioxane resin (A21) may be the same as that of the base resin in the resist, but is from 10 to 25% by weight, for example, 20% by weight. After measuring the thickness of the resin coating film, the wafer is immersed in an aqueous 2.38 wt % TMAH solution at 23° C. The time required to completely dissolve the resin film is measured and then thickness loss per unit time (nm/second) of the resin coating film is determined from the resulting time.

The resulting thickness loss of the resin coating film is a dissolution rate of the silsesquioxane resin (A21).

The weight average molecular weight (Mw) of the silsesquioxane resin (A21) is not specifically limited, but is preferably within a range from 1500 to 20000. When the weight average molecular weight is more than the above range, solubility in an organic solvent may decrease. On the other hand, when the weight average molecular weight is less than the above range, a resist pattern profile may be degraded.

The ratio Mw/Mn is not specifically limited, but is preferably within a range from 1.0 to 6.0, and more preferably from 1.0 to 2.0. When the ratio is above the above range, resolution and pattern shape may be degraded.

The silsesquioxane resins (A11) and (A21) are preferably used in combination because depth of focus and exposure margin are improved.

(Component (B))

In the present invention, the component (B) is not specifically limited and there can be used known acid generators which are used in a conventional chemically amplified resist composition. As the acid generator, there are known various acid generators, for example, onium salt-based acid generators such as iodonium salt and sulfonium salt; oxime sulfonate-based acid generators; diazomethane-based acid generators such as bisalkyl or bisarylsulfonyldiazomethanes, poly(bissulfonyl)diazomethanes and diazomethanenitrobenzyl sulfonates; iminosulfonate-based acid generators; and disulfone-based acid generators.

Specific examples of the onium salt-based acid generator include trifluoromethane sulfonate or nonafluorobutane sulfonate of diphenyliodonium, trifluoromethane sulfonate or nonafluorobutane sulfonate of bis(4-tert-butylphenyl)iodonium, trifluoromethane sulfonate of triphenylsulfonium or its heptafluoropropane sulfonate or its nonafluorobutane sulfonate, trifluoromethane sulfonate of tri(4-methylphenyl)sulfonium or its heptafluoropropane sulfonate or its nonafluorobutane sulfonate, trifluoromethane sulfonate of dimethyl (4-hydroxynaphthyl)sulfonium or its heptafluoropropane sulfonate or its nonafluorobutane sulfonate, trifluoromethane sulfonate of monophenyldimethylsulfonium or its heptafluoropropane sulfonate or its nonafluorobutane sulfonate, and trifluoromethane sulfonate of diphenylmonomethylsulfonium or its heptafluoropropane sulfonate or its nonafluorobutane sulfonate. Among these, an onium salt containing a fluorinated alkylsulfonic acid ion as an anion is preferable.

Specific examples of the oximesulfonate-based acid generator include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile and α-(methylsulfonyloxyimino)-p-bromophenylacetonitrile. Among these, α-(methylsulfonyloxyimino)-p-methoxyphenylacetonitrile is preferable.

Among the diazomethane-based acid generators, specific examples of the bisalkyl or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane.

Examples of the poly(bissulfonyl)diazomethanes include those having the following structures, for example, 1,3-bis(phenylsulfonyldiazomethylsulfonyl)propane (compound A, decomposition point: 135° C.), 1,4-bis(phenylsulfonyldiazomethylsulfonyl)butane (compound B, decomposition point: 147° C.), 1,6-bis(phenylsulfonyldiazomethylsulfonyl)hexane (compound C, melting point: 132° C., decomposition point: 145° C.), 1,10-bis(phenylsulfonyldiazomethylsulfonyl)decane (compound D, decomposition point: 147° C.), 1,2-bis(cyclohexylsulfonyldiazomethylsulfonyl)ethane (compound E, decomposition point: 149° C.), 1,3-bis(cyclohexylsulfonyldiazomethylsulfonyl)propane (compound F, decomposition point: 153° C.), 1,6-bis(cyclohexylsulfonyldiazomethylsulfonyl)hexane (compound G, melting point: 109° C., decomposition point: 122° C.) and 1,10-bis(cyclohexylsulfonyldiazomethylsulfonyl)decane (compound H, decomposition point: 116° C.).

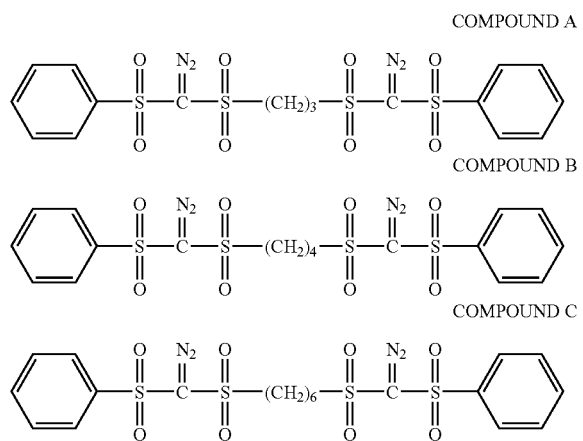

COMPOUND A

COMPOUND B

COMPOUND C

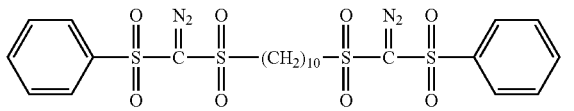

COMPOUND D

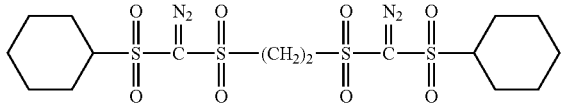

COMPOUND E

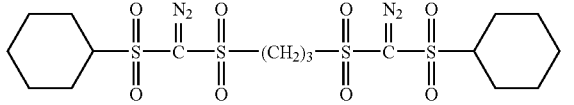

COMPOUND F

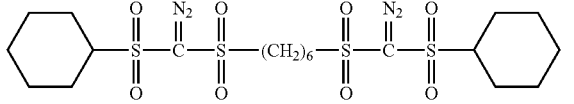

COMPOUND G

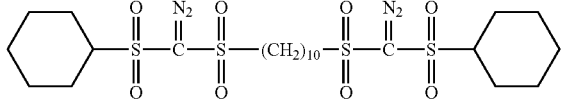

COMPOUND H

These acid generators may be used alone or in combination as the component (B).

In the present invention, the onium salt-based acid generator and/or the diazomethane-based acid generator are preferable. The onium salt-based acid generator is preferably used in combination with the diazomethane-based acid generator in the content of 10 to 80% by weight based on the weight of the onium salt-based acid generator because line edge roughness in the contact hole decreases.

In the present invention, the component (B) preferably contains an onium salt-based acid generator containing a perfluoroalkyl sulfonate having 3 to 4 carbon atoms as an anion (which hereinafter may be abbreviated to a C3-4 onium salt), because mask linearity is improved and patterns having various sizes, which are faithful to the mask, can be realized. Also the resulting patterns are excellent in proximity effect, DOF and exposure margin. The alkyl group of the perfluoroalkyl sulfonate may be linear or branched, but is preferably linear.

In the case of mixing the C3-4 onium salt as the component (B), the content of the C3-4 onium salt in the component (B) is preferably from 50 to 100% by weight.

In the case of mixing the C3-4 onium salt as the component (B), it is preferred to use in combination with an onium salt-based acid generator containing a perfluoroalkyl sulfonate having 1 carbon atom as an anion (which hereinafter may be abbreviated to C1 onium salt).

The content of the component (B) is from 0.5 to 30 parts by weight, and preferably from 1 to 10 parts by weight, based on 100 parts by weight of the component (A). When the content is less than the above range, a pattern may not be sufficiently formed. On the other hand, when the content is more than the above range, a uniform solution may not be obtained with ease and thus storage stability may be lowered.

(Component (C))

The positive resist composition of the present invention can optionally contain, in addition to the essential components (A) and (B), a low molecular weight dissolution inhibitor (C) having an acid dissociable dissolution inhibiting group, the acid dissociable dissolution inhibiting group being dissociated by an action of an acid (which hereinafter referred to as component (C)). In the case in which the positive resist composition contains, as the component (A), an alkali soluble resin component (A2) such as silsesquioxane resin (A21), it is necessary to mix with the component (C). Mixing with the component (C) can improve rectangularity, definition and line edge roughness of the pattern.

The molecular weight of the component (C) is preferably 3000 or less, and more preferably from 500 to 2000.

As the component (C), there can be used known dissolution inhibitors which have already been used in a chemically amplified positive resist composition, and examples thereof include a phenol compound having a phenolic hydroxyl group protected with an acid dissociable dissolution inhibiting group, and a carboxyl compound having a carboxyl group protected with an acid dissociable dissolution inhibiting group. As used herein, "protected" means that the hydrogen atom in at least one hydroxyl group of the phenolic hydroxyl group and the carboxyl group is substituted with an acid dissociable dissolution inhibiting group.

Examples of the phenol compound having a phenolic hydroxyl group, which can constitute the component (C) by being protected with the acid dissociable dissolution inhibiting group, include polyphenol compounds having 3 to 5 phenol groups, for example, triphenylmethane-based compound, bis(phenylmethyl)diphenylmethane-based compound and 1,1-diphenyl-2-biphenylethane-based compound, each having a hydroxyl group as a nucleus substitution group. Also di- to hexanuclear compounds obtained by formalin condensation of at least one phenol selected from among phenol, m-cresol, 2,5-xylenol can be used.

Examples of the carboxyl compound having a carboxyl group, which can constitute the component (C) by being protected with the acid dissociable dissolution inhibiting group, include biphenylcarboxylic acid, naphthalene(di)carboxylic acid, benzoylbenzoic acid and anthracenecarboxylic acid.

Examples of the acid dissociable dissolution inhibiting group for protecting the hydroxyl group or the carboxyl group in these phenol compounds or carboxyl compounds include tertiary butyloxycarbonyl groups such as tertiary butyloxycarbonyl group and tertiary amyloxycarbonyl group; tertiary alkyl groups such as tertiary butyl group and tertiary amyl group; tertiary alkoxycarbonylalkyl groups such as tertiary butyloxycarbonylmethyl group and tertiary amyloxycarbonylmethyl group; and cyclic ether groups such as tetrahydropyranyl group and tetrahydrofuranyl group.

Preferable compounds as the component (C) are produced by protecting a tetranuclear compound, obtained by condensing 2,5-xylenol with a formalin condensate, with a tertiary alkoxycarbonylalkyl group.

These components (C) may be used alone or in combination.

The content of the component (C) in the positive resist composition of the present invention is preferably from 0.5 to 40% by weight, and more preferably from 10 to 30% by weight, based on 100 parts by weight of the component (A). When the content is less than 0.5 parts by weight, sufficient dissolation inhibiting effect may not be obtained. On the other hand, when the content is more than 40% by weight, the pattern shape may become worse or lithography characteristics may become worse, and therefore it is not preferred.

(Component (D))

The positive resist composition of the present invention can further contain, as an optional component, a nitrogen-containing organic compound (D) (which hereinafter referred to as component (D)) so as to improve resist pattern shape and post-exposure stability of the latent image formed by the patternwise exposure of the resist layer.

Since various compounds have already been proposed as the component (D), it may be appropriately selected from known compounds. Among these compounds, amine, particularly secondary lower aliphatic amine and tertiary lower aliphatic amine are preferable.

As used herein, the term "lower aliphatic amine" refers to an amine of an alkyl or alkyl alcohol having 5 or fewer carbon atoms, and examples of the secondary or tertiary amine include trimethylamine, diethylamine, triethylamine, di-n-propylamine, tri-n-propylamine, tripentylamine, diethanolamine, triethanolamine and triisopropanolamine. Among these, tertiary alkanolamines such as triethanolamine and triisopropanolamine are preferable.

These amines may be used alone or in combination.

The component (D) is usually used within a range from 0.01 to 5.0 parts by weight based on 100 parts by weight of the component (A).

(Component (E))

The positive resist composition of the present invention can further contain, as an optional component, an organic carboxylic acid or oxo acid of phosphorus or its derivative (E) (which hereinafter referred to as component (E)) so as to prevent deterioration of sensitivity due to mixing with the component (D) and to improve resist pattern shape and post-exposure stability of the latent image formed by the patternwise exposure of the resist layer. The component (D) and the component (E) can be used alone or in combination.

The organic carboxylic acid is preferably malonic acid, citric acid, malic acid, succinic acid, benzoic acid or salicylic acid.

Examples of the oxo acid of phosphorus or its derivative include phosphoric acid or its derivative such as an ester, for example, phosphoric acid, phosphoric acid di-n-butyl ester or phosphoric acid diphenyl ester; phosphonic acid or its derivative such as ester, for example, phosphonic acid, phosphonic acid dimethyl ester, phosphonic acid-di-n-butyl ester, phenylphosphonic acid, phosphonic acid diphenyl ester or phosphonic acid dibenzyl ester; and phosphinic acid or its derivative such as an ester, for example, phosphinic acid or phenylphosphinate, Among these, phosphonic acid is preferable.

The content of the component (E) is from 0.01 to 5.0 parts by weight based on 100 parts by weight of the component (A).

(Other Optional Components)

If necessary, the positive resist composition of the present invention can further contain miscible additives, for example, additive resins for improving performances of the resist film, surfactants for improving coatability, dissolution inhibitors, plasticizers, stabilizers, colorants and antihalation agents.

The positive resist composition of the present invention can be produced by dissolving the above-mentioned components (A) and component (B) and optional components in an organic solvent.

In the positive resist composition of the present invention, as described above, the use of a silicone resin in combination with an organic solvent containing PGME and a solvent (S2)

makes it possible to improve the shape of the resulting resist pattern; for example, rectangularity of the pattern is improved, and LWR or LER decreases.

The reason the shape is improved is believed to be that when the compositions contains PGME and the solvent (S2), the organic solvent may be vaporized by azeotropy and thus a more rigid film can be formed even when the baking temperature is the same in the case of baking; for example, prebaking on film formation, or post-exposure baking (PEB).

One of the methods for improving the resist includes a method of improving the shape by controlling film density, and the film density is controlled-by controlling the baking temperature. According to this method, baking is not-usually conducted at a temperature higher than Tg of a base resin. When the baking temperature is too low, a rigid film cannot be formed. Therefore, baking is conducted at an optimum temperature which is lower than Tg and is higher than the minimum temperature at which a sufficiently rigid film can be formed. For example, when the above PHS-based resin is used as the base resin, Tg is from about 130 to 140° C. and the baking temperature is usually from about 90 to 105° C.

However, the silicone resin used in the two-layer resist method generally has low Tg, for example, about 105° C. and the upper limit of the baking temperature must be lowered. It is therefore believed that it becomes impossible to form a rigid film due to slight shift of the baking temperature because of narrow optimum temperature range, and thus the shape of the pattern may become worse.

According to the present inventors' resurch, when the baking temperature is the same temperature, film density of the resist film has correlation with the boiling point of the organic solvent to be used. For example, when the baking temperature is too low, the resulting pattern has a draggle-tailed shape and it becomes difficult to obtain a proper shape. The reason is believed to be that the acid generated from the component (B) is excessively diffused because a large amount of the organic solvent remains in the resist film after baking.

In the present invention, therefore, when PGME is used in combination with the solvent (S2), the organic solvent is less likely to remain and film density increases even at the same PEB temperature as that of the prior art, and thus a more rigid film can be formed. Therefore, even when using the silicone resin, it becomes possible to satisfactorily control diffusion of the acid and LER or LWR of the resist pattern can be improved.

The above effect makes it possible to obtain a wider DOF when a resist pattern, particularly contact hole (CH), is formed by applying the positive resist composition of the present invention. Although the reason is not certain, the effect of improving sensitivity and widening exposure dose margin is also exerted.

In the present invention, the positive resist composition is rapidly dried during spin drying on application because of high volatility of PGME. Therefore, there is an advantage that a thick film can be obtained as compared with a conventional positive resist composition even in the case of the same solid content, and the solid content in the resist composition can be decreased.

The positive resist composition of the present invention can be preferably used for a method of patterning a support using a two-layer resist.

A resist laminate used as the two-layer resist will now be described.

(Resist laminate)

The resist laminate includes a support, a lower organic layer, which is insoluble in an alkali developer solution and is dry-etchable, and an upper resist layer made of the positive resist composition of the present invention, the lower organic layer and the upper resist layer being laminated on the support.

The support is not specifically limited and a conventionally known one can be used. Examples thereof include substrate for electronic components, and substrate having a predetermined wiring pattern formed thereon.

Examples of the substrate include silicon wafer, substrate made of metal such as copper, chromium, iron or aluminum, and glass substrate.

As the material for wiring pattern, for example, copper, aluminum, nickel and gold can be used.

The lower organic layer is an organic film which is insoluble in an alkali developer solution used in the development after exposure, and is etchable by a dry etching method.

By using such a lower organic layer, only the upper resist layer is subjected to exposure and alkali development by conventional photolithography to form a resist pattern, and then the resist pattern of the upper resist layer is transferred to the lower organic layer by dry-etching the lower organic layer via the resist pattern as a mask. Consequently, a resist pattern having a high aspect ratio can be formed without causing pattern falling of a resist pattern.

The organic film material for forming the lower organic layer does not necessarily have a photosensitivity like that of the upper resist layer. A resist or resin, which is generally used as a base material in the production of semiconductor devices and light crystal display devices, may be used.

Since the upper layer resist pattern must be transferred to the lower layer, the lower organic layer is preferably made of a material which is etchable with oxygen plasma.

As the material, for example, materials containing at least one selected from the group consisting of novolak resin, acrylic resin and soluble polyimide as a main component are preferably-used because they are easily etchable with oxygen plasma and are excellent in resistance to a fluorocarbon gas used for etching of a silicon substrate in the post-process.

Among these materials, a novolak resin, and an acrylic resin having an alicyclic moiety or an aromatic ring in the side chain are preferably used because they are cheap and are widely used, and are also excellent in dry etching resistance in the post-process.

As the novolak resin, those used generally in the positive resist composition can be used, and also a positive resist for i-rays or g-rays, containing a novolak resin as a main component can be used.

The novolak resin is a resin obtained by addition condensation of an aromatic compound having a phenolic hydroxyl group (which hereinafter referred to simply as "phenols") and aldehydes in the presence of an acid.

Examples of phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinonemonomethyl ether, pyrogallol, fluoroglycinol, hydroxydiphenyl, bisphenol A, gallic acid, gallate ester, α-naphthol and β-naphthol.

Examples of aldehydes include formaldehyde, furfural, benzaldehyde, nitrobenzaldehyde and acetaldehyde.

Although the catalyst used in the addition condensation reaction is not specifically limited, hydrochloric acid, nitric acid, sulfuric acid, formic acid, oxalic acid and acetic acid may be used as the acid catalyst.

The weight average molecular weight of the novolak resin is preferably within a range from 5000 to 50000, more preferably from 6000 to 9000, and still more preferably from 7000 to 8000. When the weight average molecular weight is less than 5000, the novolak resin may cause sublimation when baked at high temperature. On the other hand, when the weight average molecular weight is more than 50000, it may become impossible to perform dry etching, and therefore it is not preferred.

The novolak resin, which can be used in the present invention, is commercially available and is preferably a novolak resin which has a content of a low molecular weight component having a molecular weight of 500 or less, preferably 200 or less, of 1% by weight or less, preferably 0.8% by weight or less, determined using gel permeation chromatography. The smaller the content of the low molecular weight component, the better. The content is preferably 0% by weight.

The "low molecular weight component having a molecular weight of 500 or less" is detected as a low-molecular fraction having a molecular weight of 500 or less when analyzed by a GPC method using polystyrene standards. The "low molecular weight component having a molecular weight of 500 or less" includes a non-polymerized monomer, and those having low polymerization degree, for example, those obtained by condensing 2 to 5 molecules of phenols with aldehydes, although this varies depending on the molecular weight.

The content (% by weight) of the low molecular weight component having a molecular weight of 500 or less is measured by plotting a fraction number (abscissa) versus a concentration (ordinate) of the analysis results obtained by the GPC method to form a graph, and determining a ratio (%) of the area under the curve of the low molecular weight component having a molecular weight of 500 or less to the entire area under the curve.

With respect to the meaning and the method for measurement of the content of the "low molecular weight component having a molecular weight of 200 or less", "500" may be replaced by "200" in the meaning and the method for measurement of the content of the "low molecular weight component having a molecular weight of 500 or less" By adjusting Mw of the novolak resin to 50000 or less, excellent embedding into a substrate having fine irregularity is attained. By adjusting Mw of the novolak resin to 5000 or more, etching resistance to a fluorocarbon gas is obtained, and therefore it is preferred.

When the content of the low molecular weight component having a molecular weight of 500 or less is 1% by weight or less, excellent embedding into a substrate having fine irregularity is attained. The reason is not apparent but it is believed that the dispersion degree decreases.

As the acrylic resin, there can be used those which are generally used in the positive resist composition. The acrylic resin includes, for example, an acrylic resin including a constituent unit derived from a polymerizable compound having an ether bond, and a constituent unit derived from a polymerizable compound having a carboxyl group.

Examples of the polymerizable compound having an ether bond include (meth)acrylic acid derivatives having an ether bond and an ester bond, such as 2-methoxyethyl (meth)acrylate, methoxytriethylene glycol(meth)acrylate, 3-methoxybutyl (meth)acrylate, ethylcarbitol(meth)acrylate, phenoxypolyethylene glycol(meth)acrylate, methoxypolypropylene glycol(meth)acrylate and tetrahydrofurfuryl(meth)acrylate. These compounds can be used alone or in combination.

Examples of the polymerizable compound having a carboxyl group include monocarboxylic acids such as acrylic acid, methacrylic acid and crotonic acid; dicarboxylic acids such as maleic acid, fumaric acid and itaconic acid; and compounds having a carboxyl group and an ester bond, such as 2-methacryloyloxyethylsuccinic acid, 2-methacryloyloxyethylmaleic acid, 2-methacryloyloxyethylphthalic acid and 2-methacryloyloxyethylhexahydrophthalic acid. Among these compounds, acrylic acid and methacrylic acid are preferable. These compounds can be used alone or in combination.

The soluble polyimide is a polyimide which can be formed into liquid by using the organic solvent described above.

In the resist laminate of the present invention, in view of throughput balance taking account of the objective aspect ratio and the time required to dry etching of the lower organic layer, the total thickness of the upper resist layer and the lower organic layer is preferably 15 μm or less, and more preferably 5 μm or less. The lower limit of the total thickness is not specifically limited, but is preferably 0.1 μm or more, and more preferably 0.35 μm or more.

The thickness of the upper resist layer is preferably from 50 to 1000 nm, more preferably from 50 to 800 nm, and still more preferably from 100 to 500 nm. By adjusting the thickness of the upper resist layer within the above range, there can be exerted such effects that a resist pattern can be formed with high resolution and sufficient resistance to dry etching can be obtained.

The thickness of the lower organic layer is preferably within a range from 300 to 20000 nm, more preferably from 300 nm to 8000 nm, and still more preferably from 400 to 5000 nm. By adjusting the thickness of the lower organic layer within the above range, there can be exerted such effects that a resist pattern having a high aspect ratio can be formed and sufficient etching resistance can be secured when the substrate is etched.

In the present invention, the resist laminate include a laminate in which the resist pattern is formed on the upper resist layer and the lower organic layer, and a laminate in which the resist pattern is not formed on the upper resist layer and the lower organic layer.

(Method for Formation of Resist Pattern)

The method for formation of a resist pattern using such a resist laminate can be conducted by the following procedure.

First, a resist composition or solution for formation of a lower organic layer is applied onto a substrate such as a silicon wafer using a spinner, and then subjected to a baking treatment under heating conditions of a temperature of 200 to 300° C. for 30 to 300 seconds, preferably 60 to 180 seconds to form a lower organic layer.

An organic or inorganic anti-reflection film may be provided between the lower organic layer and the upper resist layer.

The positive resist composition of the present invention is applied onto the lower organic layer using a spinner, and it is then prebaked under the conditions of a temperature of 70 to 150° C. for 40 to 180 seconds, preferably 60 to 90 seconds to form an upper resist layer, and thus a resist laminate is obtained. To prevent the occurrence of white edge, it is effective to set the heating temperature within a range from about 70 to 90° C.

This resist laminate is selectively exposed to a KrF excimer or the like laser via a desired mask pattern using a KrF aligner or the like, and then subjected to PEB (post-exposure baking) under the conditions of a temperature of 70 to 150° C. for 40 to 180 seconds, preferably 60 to 90 seconds.

Then, the resist laminate is subjected to a development treatment with an alkali developer solution, for example, 0.05 to 10% by weight, preferably 0.05 to 3% by weight of an aqueous tetramethylammonium hydroxide solution. Consequently, it is made possible to form a resist pattern (I), which is faithful to the mask pattern, on the upper resist layer.

As the light source used for exposure, a KrF excimer laser and an electron beam are particularly useful. However, radiation such as from an ArF excimer laser, an $F_2$ excimer laser, an EUV (extreme ultraviolet ray), a VUV (vacuum ultraviolet ray), an electron beam (EB), an X-ray and a soft X-ray are also useful. When using an electron beam (EB), selective irradiation with an electron beam via a mask, or drawing may be carried out.

Using the resulting resist pattern (I) as a mask pattern, dry etching of the lower organic layer is conducted to form a resist pattern (II) on the lower organic layer.

As the dry etching method, there can be used known methods, for example, chemical etching methods such as downflow etching and chemical dry etching; physical etching methods such as spatter etching and ion beam etching; and chemical and physical etching methods such as RIE (reactive ion etching).

The most popular dry etching method is the parallel-plate RIE method. According to this method, a resist laminate is placed in a chamber of an RIE system and a required etching gas is introduced. When a high frequency voltage is applied to a holder of the resist laminate disposed in parallel to an upper electrode in the chamber, the gas is converted into plasma. In the plasma, charged particles such as positive or negative ions or electrons, and neutral active species exist. When these etching species are adsorbed onto the lower organic layer, a chemical reaction occurs and the reaction product is eliminated from the surface and is then discharged, and thus etching proceeds.

Examples of the etching gases include oxygen gas and sulfur dioxide gas. Among these etching gasses, oxygen gas is preferably used because the etching with oxygen plasma yields high resolution, and also the silsesquioxane resins (A11), (A12) and (A21) of the present invention show high etching resistance to oxygen plasma and is widely used.

As described above, a resist pattern including a resist pattern (I) and a resist pattern (II) laminated one upon another is obtained. A fine pattern can be formed on a support by etching via the resulting resist pattern as a mask.

As the etching method, for example, an etching method using a halogen-based gas can be preferably used.

According to the method of forming a resist pattern of the present invention, since the upper resist layer is made of the positive resist composition of the present invention, it is made possible to form a resist pattern which is excellent in shape.

EXAMPLES

The present invention will now be described by way of examples, but the scope of the present invention is not limited to the following examples.

Synthesis Example 1

Synthesis Example of Silsesquioxane Resin (A12)

In a 500 ml three-necked flask equipped with a stirrer, a reflux condenser, a dropping funnel and a thermometer, 84.0 g (1.0 mol) of sodium hydrogencarbonate and 400 ml of water were charged and a mixed solution of 51.1 g (0.20 mol) of p-methoxybenzyltrichlorosilane, 21.1 g (0.10 mol) of phenyltrichlorosilane and 100 ml of diethyl ether was added dropwise over 2 hours from a dropping funnel, followed by aging for one hour. After the completion of the reaction, the reaction mixture was extracted with ether and ether was distilled off under reduced pressure. To the resulting hydrolysate, 0.2 g of a 10 wt % solution of potassium hydroxide was added, followed by heating at 200° C. for 2 hours to obtain a copolymer $A_1$ of p-methoxybenzylsilsesquioxane and phenylsilsesquioxane.

Then, 50 g of resulting copolymer A1 was dissolved in 150 ml of acetonitrile and 80 g (0.40 mol) of trimethylsilyliodine was added. After stirring under reflux for 24 hours, 50 ml of water was added and the solution was reacted by stirring under reflux for 12 hours. After cooling, free iodine was reduced with an aqueous sodium hydrogensulfite solution and the organic layer was separated. After the solvent was distilled off under reduced pressure, the resulting polymer was reprecipitated from acetone and n-hexane and then dried with heating under reduced pressure to obtain a copolymer $A_2$ including 70% by mole of p-hydroxybenzylsilsesquioxane and 30% by mole of phenylsilsesquioxane.

Then, 40 g of the resulting copolymer $A_2$ was dissolved in 200 ml of tetrahydrofuran (THF) and 1.0 g of p-toluene-sulfonic acid monohydrate as the acid catalyst and 6.5 g of cyclohexyl vinyl ether were added, and the mixture was reacted under the conditions of a temperature of 23° C. for about 3 hours. While stirring, the reaction solution was poured into water to deposit a polymer to obtain 40 g of a silsesquioxane resin (X1) represented by the following chemical formula (IX). In the formula, 1:m:n=55% by mole: 15% by mole:30% by mole, and the weight average molecular weight of the resin is 7600.

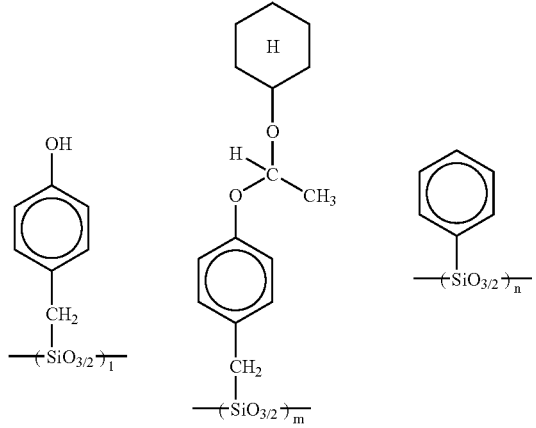

(IX)

Synthesis Example 2

In the same manner as in Synthesis Example 1, except that 6.5 g of cyclohexy vinyl ether was replaced by 5.0 g of ethyl vinyl ether, the reaction was conducted. As a result, 40 g of a silsesquioxane resin (X2) represented by the following chemical formula (X) was obtained. In the formula, 1:m: n=54% by mole: 16% by mole:30% by mole, and the weight average molecular weight of the resin is 8500.

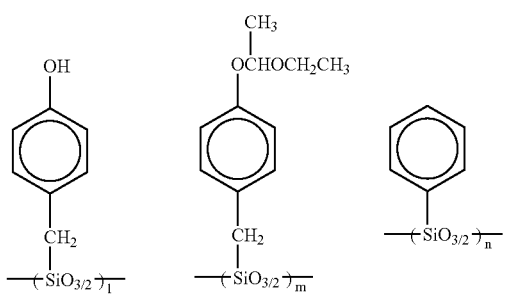

(X)

Example 1

100 Parts by weight of the silsesquioxane resin (X1) obtained in Synthesis Example 1 was dissolved in 930 parts by weight of a solvent mixture (ethyl lactate/propylene glycol monomethyl ether =80/20 (weight ratio)) and then 3.0 parts by weight of triphenylsulfonium trifluoromethane sulfonate as the component (B), 0.328 parts by weight of triethanolamine as the component (D), 0.081 parts by weight of malonic acid as the component (E) and 20 parts by weight of a low molecular weight dissolution inhibitor (DI22) represented by the following chemical formula (XI) as the component (C) were added to prepare a positive resist composition (Si content: about 13%).

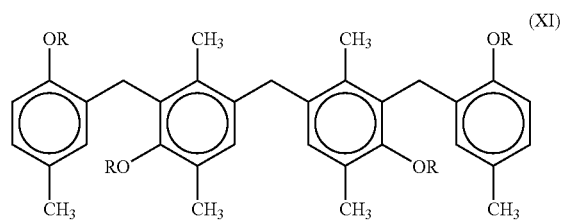

(XI)

R represents a —$CH_2COO$-tert-butyl group

TBLC-100 (manufactured by Tokyo Ohka Kogyo Co., Ltd.) as a base film material was applied onto a silicon substrate using a spinner, and then subjected to a baking treatment at 230° C. for 90 seconds to form a base film having a thickness of 425 nm.

The positive resist composition obtained previously was applied onto the base film using a spinner, and then subjected to a baking treatment at 85° C. for 90 seconds to form a resist film having a thickness of 150 nm.

Then, the resist film was selectively irradiated with a KrF excimer laser (248 nm) via a halftone type (transmittance: 6%) mask pattern using a KrF aligner NSR-S205C (manufactured by Nikon Corporation; NA (numerical aperture) =0.75, ⅔ zonal illumination).

The resist film was subjected to a PEB treatment under the conditions of a temperature of 95° C. for 90 seconds, and then subjected to a development treatment with an aqueous 2.38 wt % tetramethylammonium hydroxide solution at 23° C. for 60 seconds to obtain a line-and-space (L&S) pattern (110 nmLS) having a line width of 110 nm and a pitch of 220 nm and a line-and-space (L&S) pattern (90 nmLS) having a line width of 90 nm and a pitch of 220 nm.

A profile of the resulting L&S patterns (110 nmLS and 90 nmLS) was observed by a scanning electron microscope (SEM) and each optimum exposure dose (Eop) was determined.

As a result, both of the resulting L&S patterns (110 nmLS and 90 nmLS) were excellent in rectangularity. Eop of the L&S pattern (110 nmLS) was 51.0 $mJ/cm^2$, and Eop of the L&S pattern (90 nmLS) was 57.0 $mJ/cm^3$.

Exposure dose margin, at which a line-and-space pattern (1:1) having a line width of 110 nm can be formed within an error range of ±10%, was determined. As a result, exposure dose margin was about 11.54%.

In the same manner as described above, a line-and-space pattern having a line width of 120 nm and a pitch of 240 nm was formed and 3σ as a measure of LWR was determined. As a result, it was 13.90 nm.

In this example, 3σ is triple the value (3σ) of a standard deviation (σ) calculated from the results of the measurement of the width of the resist pattern of samples at 41 positions at intervals of 100 µm in the line direction using a measuring SEM (manufactured by Hitachi, Ltd. under the trade name of "S-9220"). The smaller the value of 3σ, the less roughness and more uniform width the resulting resist pattern may have.

In the exposure dose (Eop) determined as described above, focus was shifted up and down and a resist pattern was formed in the same manner as described above and then the depth of focus (DOF), at which a L&S pattern having line width of 110 nm is obtained with a predetermined size ±10%, was determined. As a result, a resist pattern having excellent shape was formed at the depth of focus within a range from ±0.3 µm to 0.3 µm (DOF=0.6 µm).

Example 2

100 Parts by weight of a mixture of 85 parts by weight of the silsesquioxane resin (X1) obtained in Synthesis Example 1 and 15 parts by weight of the silsesquioxane resin (X2) obtained in Synthesis Example 2 was dissolved in 930 parts by weight of a solvent mixture (ethyl lactate/propylene glycol monomethyl ether =70/30 (weight ratio)) and then 1.6 parts by weight of a compound represented by the following Chemical Formula (XII), 3.4 parts by weight of bis(tert-butylphenyl)iodoniumnonafluorobutane sulfonate and 2.0 parts by weight of bis(cyclohexylsulfonyl)diazomethane as the component (B), 0.4 parts by weight of triisopropanolamine as the component (D) and 20 parts by weight of a low molecular weight dissolution inhibitor (DI22) represented represented by the following chemical formula (XI) as the component (C) were added to prepare a positive resist composition (Si content: about 16%).

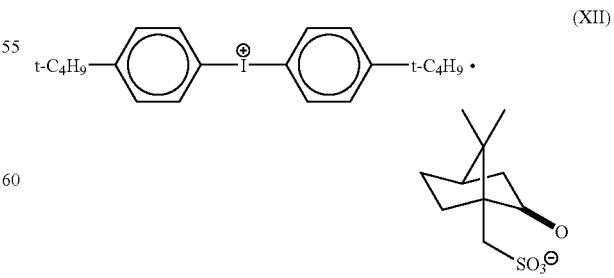

(XII)

TBLC-100 (manufactured by Tokyo Ohka Kogyo Co., Ltd.) as a base film material was applied onto a silicon substrate using a spinner, and then subjected to a baking treatment at 230° C. for 90 seconds to form a base film having a thickness of 425

The positive resist composition obtained previously was applied onto the base film using a spinner, and then subjected to a baking treatment at 90° C. for 90 seconds to form a resist film having a thickness of 160 nm. Then, the resist film was selectively irradiated with KrF excimer laser (248 nm) via a halftone type (transmittance: 6%) mask pattern using a KrF aligner NSR-S203B (manufactured by Nikon Corporation; NA (numerical aperture)=0.68, σ=0.60).

The resist film was subjected to a PEB treatment under the conditions of a temperature of 100° C. for 90 seconds, and then subjected to a development treatment with an aqueous 2.38 wt % tetramethylammonium hydroxide solution at 23° C. for 60 seconds to form a hole pattern having an aperture of 160 nm. Then, the hole pattern was evaluated in the same manner as in Example 1.

As a result, the profile of a contact hole having an aperture of 160 nm was excellent in rectangularity.

Eop was 42.0 mJ/cm². Exposure dose margin was 12.73%. DOF was 0.4 μm.

Comparative Example 1

In the same manner as in Example 1, except that 930 parts by weight of ethyl lactate was used alone as the organic solvent, a positive resist composition was prepared and a resist pattern was formed, and then the evaluation was conducted in the same manner as described above.

As a result, the profile of both of the resulting L&S pattern (110 nmLS) and L&S pattern (90 nmLS) was inferior in rectangularity because the upper portion of the pattern has roundness. Eop of the L&S pattern (110 nmLS) was 57.0 mJ/cm² and Eop of the L&S pattern (90 nmLS) was 61.0 mJ/cm².

Exposure dose margin was 9.92%.
3 σ was 15.12 nm.
DOF was 0.6 μm.

Comparative Example 2

Using the positive resist composition prepared in Comparative Example 1, a hole pattern was formed.

TBLC-100 (manufactured by Tokyo Ohka Kogyo Co., Ltd.) as a base film material was applied onto a silicon substrate using a spinner, and then subjected to a baking treatment at 230° C. for 90 seconds to form a base film having a thickness of 425 nm.

The positive resist composition obtained previously was applied onto the base film using a spinner, and then subjected to a baking treatment at 85° C. for 90 seconds to form resist film having a thickness of 160 nm. Then, the resist film was selectively irradiated with KrF excimer laser (248 nm) via a halftone type (transmittance: 6%) mask pattern using a KrF aligner NSR-S203B (manufactured by Nikon Corporation; NA (numerical aperture)=0.68, σ=0.60).

The resist film was subjected to a PEB treatment under the conditions of a temperature of 95° C. for 90 seconds, and then subjected to a development treatment with an aqueous 2.38 wt % tetramethylammonium hydroxide solution at 23° C. for 60 seconds to form a hole pattern having an aperture of 160 nm. Then, the hole pattern was evaluated in the same manner as in Example 1.

As a result, the profile of a contact hole having an aperture of 160 nm was inferior in rectangularity as compared with Example 2. Eop was 52.0 mJ/cm². Exposure dose margin was 11.32%. DOF was 0.3 μm.

As described above, the resist pattern obtained by using the positive resist composition of Example 1 was excellent in shape; for example, it has high rectangularity and improved LWR. The resist pattern exhibited wide DOF in the case of formation of the resist pattern, high sensitivity, and large exposure dose margin. The contact hole pattern obtained by using the positive resist composition of Example 2 exhibited wide DOF as compared with a conventional product while maintaining a rectangular shape.

What is claimed is:

1. A positive resist composition comprising a base resin component (A) and an acid generator component (B) generating an acid under exposure, which are dissolved in an organic solvent, wherein the base resin component (A) is a silicone resin, and the organic solvent contains propylene glycol monomethyl ether and a solvent (S2) having a boiling point higher than that of the propylene glycol monomethyl ethes, wherein the content of the propylene glycol monomethyl ether in the organic solvent is from 10 to 60% by weight, wherein the base resin component (A) is a resin component (Ar) having an acid dissociable dissolution inhibiting group, the dissociation inhibiting group being dissociated by an action of an acid thereby enhancing alkali solubility, wherein the solvent (S2) comprises ethyl lactate; and the resin component (A1) contains a silsesquloxane resin (A12) comprising a constituent unit (a1) represented by the following general formula (I):

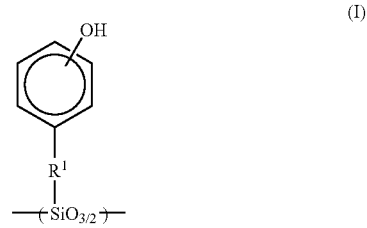

(I)

wherein R¹ represents a linear or branched alkylene group having 1 to 5 carbon atoms, and a constituent unit (a5) represented by the following general formula (V):

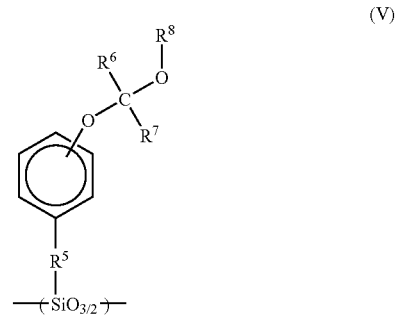

(V)

wherein R⁵ represents a linear or branched alkylene group having 1 to 5 carbon atoms, R⁶ represents an alkyl group having 1 to 5 carbon atoms, R⁷ represents an alkyl group having 1 to 5 carbon atoms or a hydrogen atom, and R⁸ represents an alicyclic hydrocarbon group having 5 to 15 carbon atoms, and a silsesquioxane resin (A11) comprising a constituent unit (a1) represented by the following general formula (I):

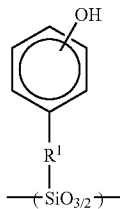
(I)

wherein R¹ represents a linear or branched alkylene group having 1 to 5 carbon atoms, a constituent unit (a2) represented by the following general formula (II):

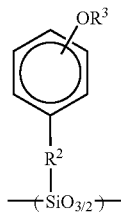
(II)

wherein R² represents a linear or branched alkylene group having 1 to 5 carbon atoms, and $R_3$ represents an acid dissociable dissolution inhibiting group, and a constituent unit (a3) represented by the following general formula (III)

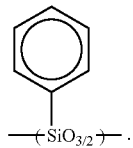
(III)

2. The positive resist composition according to claim 1, wherein the solvent (S2) further comprises at least one selected from the group consisting of propylene glycol monomethyl ether acetate and Y-butyrolactone.

3. The positive resist composition according to claim 1, wherein the total content of the constituent units (a1) and (a2) is 50% by mole or more based on the total amount of all constituent units of the silsesquioxane resin (A11), and the content of the constituent unit (a2) is 10% by mole or more based on the total amount of the constituent units (a1) and (a2).

4. The positive resist composition according to claim 1, wherein the acid dissociable dissolution inhibiting group is an alkoxyalkyl group.

5. The positive resist composition according to claim 4, wherein the alkoxyalkyl group is a 1-ethoxyethyl group.

6. The positive resist composition according to claim 1, wherein the silsesquioxane resin (A12) further comprises a constituent unit (a3) represented by the following general formula (III):

7. The positive resist composition according to claim 1, wherein the total content of the constituent units (a1) and (a5) is 50% by mole or more based on the total amount of all constituent units of the silsesquioxane resin (A12), and the content of the constituent unit (a5) is 5% by mole or more and 50% by mole or less based on the total amount of the constituent units (a1) and (a5).

8. The positive resist composition according to claim 1, which further comprises a low molecular weight dissolution inhibitor (C) having an acid dissociable dissolution inhibiting group, the acid dissociable dissolution inhibiting group being dissociated by an action of an acid.

9. The positive resist composition according to claim 8, wherein the low molecular weight dissolution inhibitor (C) is a phenol compound having a phenolic hydroxyl group protected with an acid dissociable dissolution inhibiting group, or a carboxyl compound having a carboxyl group protected with an acid dissociable dissolution inhibiting group.

10. The positive resist composition according to claim 1, wherein the acid generator component (B) is an onium salt-based acid generator and/or a diazomethane-based acid generator.

11. The positive resist composition according to claim 1, which further comprises a nitrogen-containing organic compound (D).

12. The positive resist composition according to claim 1, further comprising a component (E) which is an organic carboxylic acid or oxo acid of phosphorus or its derivative.

* * * * *

UNITED STATES PATENT AND TRADEMARK OFFICE
CERTIFICATE OF CORRECTION

PATENT NO. : 7,416,832 B2
APPLICATION NO. : 11/091618
DATED : August 26, 2008
INVENTOR(S) : Kawana et al.

It is certified that error appears in the above-identified patent and that said Letters Patent is hereby corrected as shown below:

Column 2, Line 67-Delete "20to" and insert -- 20 to --, therefor.

Column 9, Line 60-Delete "(a1)" and insert -- (a3) --, therefor.

Column 11, Line 52-Delete "(A2 1)" and insert -- (A21) --, therefor.

Column 15, Line 66-Delete "dissolation" and insert -- dissolution --, therefor.

Column 16, Line 50-Before "Among" delete "," and insert -- . --, therefor.

Column 17, Line 12-Delete "controlled-by" and insert -- controlled by --, therefor.

Column 17, Line 13-Delete "not-usually" and insert -- not usually --, therefor.

Column 17, Line 29-Delete "resurch," and insert -- research, --, therefor.

Column 20, Line 44-Delete "of200" and insert -- of 200 --, therefor.

Column 21, Line 61-Delete "Synthesis Example of Silsesquioxane Resin (A12)" and insert -- (Synthesis Example of Silsesquioxane Resin (A 12)) --, therefor. (Sub Heading)

Column 22, Line 34-Delete "1:m:n" and insert -- l:m:n --, therefor.

Column 22, Line 65-66-Delete "1:m:n" and insert -- l:m:n --, therefor.

Column 24, Line 8-Delete "$cm^3$." and insert -- $cm^2$. --, therefor.

Column 24, Line 31-Delete "±0.3" and insert -- +0.3 --, therefor.

Column 24, Line 49-Before "by" delete "represented". (Second Occurrence)

Column 24, Line 49-Delete "following" and insert -- above --, therefor.

Column 25, Line 3-After "425" insert -- nm. --.

UNITED STATES PATENT AND TRADEMARK OFFICE
CERTIFICATE OF CORRECTION

PATENT NO. : 7,416,832 B2
APPLICATION NO. : 11/091618
DATED : August 26, 2008
INVENTOR(S) : Kawana et al.

It is certified that error appears in the above-identified patent and that said Letters Patent is hereby corrected as shown below:

Column 26, Line 19-In Claim 1, delete "ethes," and insert -- ether, --, therefor.

Column 26, Line 23-In Claim 1, delete "(Ar)" and insert -- (Al) --, therefor.

Column 26, Line 28-In Claim 1, delete "silsesquloxane" and insert -- silsesquioxane --, therefor.

Column 27, Line 31-In Claim 1, delete "$R_3$" and insert -- $R^3$ --, therefor.

Column 27, Line 47-In Claim 2, delete "Y-butyrolactone." and insert

-- γ-butyrolactone. --, therefor.

Column 28, Line 10-In Claim 6, delete "silscsquioxane" and insert -- silsesquioxane --, therefor.

Signed and Sealed this

Seventeenth Day of March, 2009

JOHN DOLL
*Acting Director of the United States Patent and Trademark Office*